(12) United States Patent
Zhu et al.

(10) Patent No.: US 8,320,169 B2
(45) Date of Patent: Nov. 27, 2012

(54) ASYMMETRIC WRITE CURRENT COMPENSATION

(75) Inventors: Wenzhong Zhu, Apple Valley, MN (US); Yong Lu, Edina, MN (US); Xiaobin Wang, Chanhassen, MN (US); Yiran Chen, Eden Prairie, MN (US); Alan Xuguang Wang, Eden Prairie, MN (US); Xiaohua Lou, Milpitas, CA (US); Haiwen Xi, Prior Lake, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/333,598

(22) Filed: Dec. 21, 2011

(65) Prior Publication Data
US 2012/0087175 A1    Apr. 12, 2012

Related U.S. Application Data

(63) Continuation of application No. 13/016,445, filed on Jan. 28, 2011, now Pat. No. 8,107,282, which is a continuation of application No. 12/408,996, filed on Mar. 23, 2009, now Pat. No. 7,881,096.

(60) Provisional application No. 61/103,726, filed on Oct. 8, 2008.

(51) Int. Cl.
*G11C 11/00* (2006.01)

(52) U.S. Cl. ............ 365/158; 365/148; 365/171

(58) Field of Classification Search ............ 365/148, 365/158, 171, 173; 257/295, 423; 438/3, 438/268
See application file for complete search history.

(56) References Cited

U.S. PATENT DOCUMENTS

| | | | |
|---|---|---|---|
| 6,005,800 A | 12/1999 | Koch et al. | |
| 6,855,504 B2 | 2/2005 | Fogarty | |
| 6,903,400 B2 | 6/2005 | Kikuchi et al. | |
| 7,068,531 B2 | 6/2006 | Katti | |
| 7,313,014 B2 | 12/2007 | Ooishi | |
| 7,852,660 B2 | 12/2010 | Zhu et al. | |
| 7,881,095 B2* | 2/2011 | Lu et al. | 365/148 |
| 7,881,096 B2 | 2/2011 | Zhu et al. | |
| 8,009,458 B2* | 8/2011 | Lu et al. | 365/148 |
| 8,107,282 B2* | 1/2012 | Zhu et al. | 365/158 |
| 8,125,814 B2* | 2/2012 | Tsai | 365/80 |
| 8,203,893 B2* | 6/2012 | Li et al. | 365/189.09 |
| 2002/0175386 A1 | 11/2002 | Kim et al. | |
| 2008/0061388 A1 | 3/2008 | Diao et al. | |
| 2010/0091550 A1 | 4/2010 | Chen et al. | |
| 2010/0110763 A1 | 5/2010 | Li et al. | |
| 2010/0118588 A1 | 5/2010 | Chen et al. | |
| 2010/0157664 A1 | 6/2010 | Chung | |
| 2011/0122674 A1 | 5/2011 | Lin et al. | |
| 2012/0120713 A1* | 5/2012 | Lu et al. | 365/148 |

OTHER PUBLICATIONS

J. C. Slonczewski, "Currents, torques, and polarization factors in magnetic tunnel junctions," Physical Review B 71, 2005, pp. 1-10, The American Physical Society, US. J. Z. Sun, "Spin-current interaction with a monodomain magnetic body: A model study," Physical Review B, 2000, pp. 570-578, vol. 62, No. 1, The American Physical Society, US.

* cited by examiner

*Primary Examiner* — Gene Auduong
(74) *Attorney, Agent, or Firm* — Hall Estill Attorneys at Law

(57) ABSTRACT

An apparatus and method for compensating for asymmetric write current in a non-volatile unit cell. The unit cell comprises a switching device and an asymmetric resistive sense element (RSE), such as an asymmetric resistive random access memory (RRAM) element or an asymmetric spin-torque transfer random access memory (STRAM) element. The RSE is physically oriented within the unit cell relative to the switching device such that a hard direction for programming the RSE is aligned with an easy direction of programming the unit cell, and an easy direction for programming the RSE is aligned with a hard direction for programming the unit cell.

20 Claims, 7 Drawing Sheets

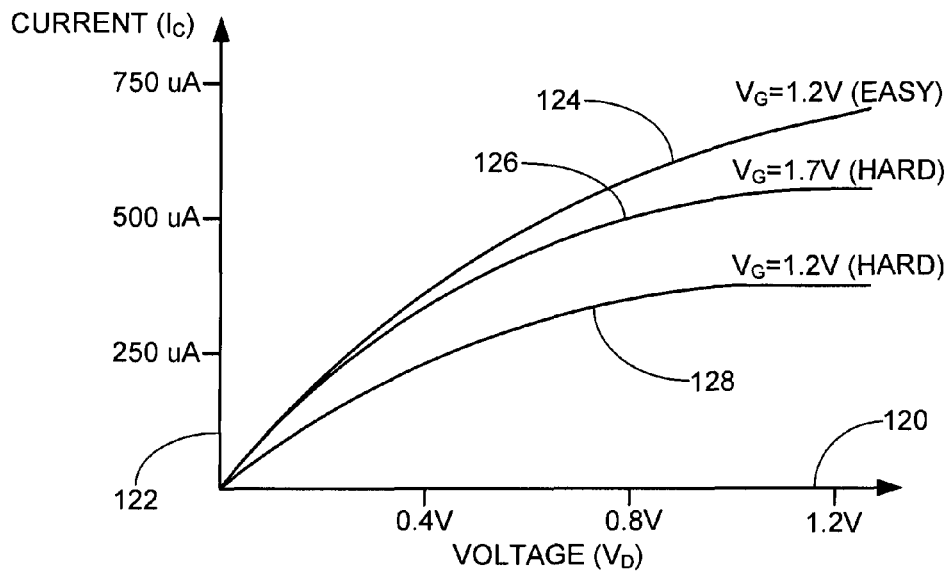
FIG. 3
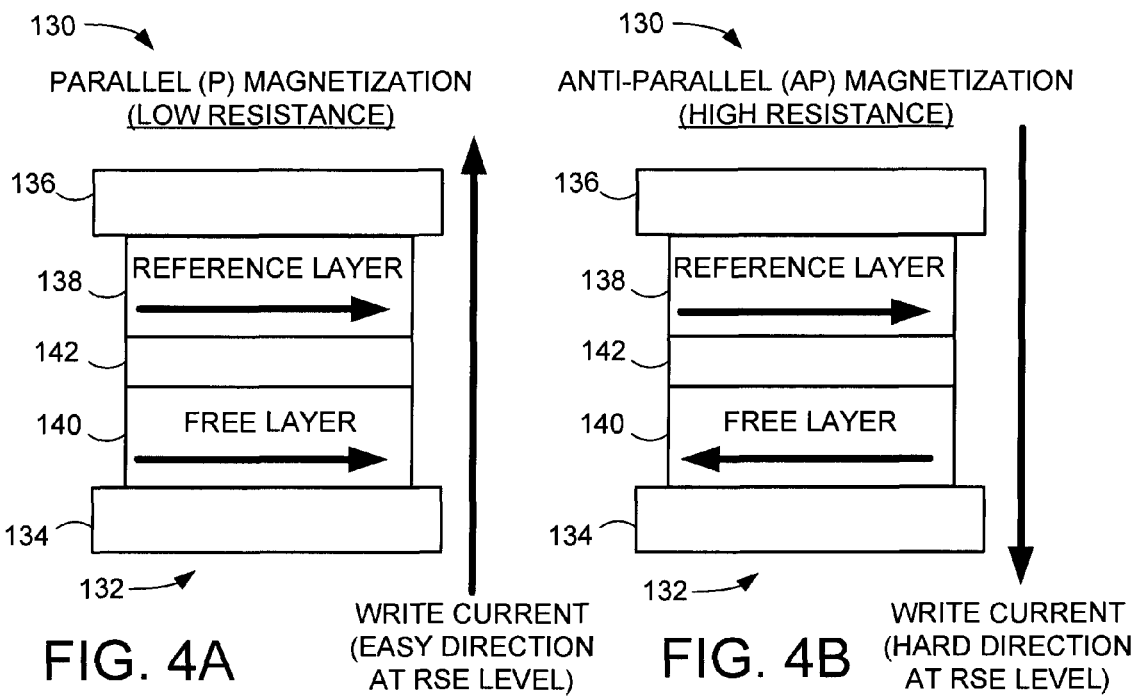
FIG. 4A
FIG. 4B

ASYMMETRIC WRITE CURRENT COMPENSATION

RELATED APPLICATIONS

This application is a continuation of copending U.S. patent application Ser. No. 13/016,445 filed Jan. 28, 2011 which is a continuation of U.S. patent application Ser. No. 12/408,996 filed Mar. 23, 2009, now U.S. Pat. No. 7,881,096 issued Feb. 1, 2011 and which makes a claim of domestic priority under 35 U.S.C. §119(e) to U.S. Provisional Patent Application No. 61/103,726 filed Oct. 8, 2008.

BACKGROUND

Data storage devices generally operate to store and retrieve data in a fast and efficient manner. Some storage devices utilize a semiconductor array of solid-state memory cells to store individual bits of data. Such memory cells can be volatile or non-volatile. Volatile memory cells generally retain data stored in memory only so long as operational power continues to be supplied to the device, while non-volatile memory cells generally retain data storage in memory even in the absence of the application of operational power.

Some non-volatile memory cells utilize a ferromagnetic construction to store data, such as magnetic random access memory (MRAM) and spin-torque transfer random access memory (STRAM). Such memory cells often utilize a reference layer and a free layer separated by an oxide layer. The magnetization of the reference layer is maintained in a constant orientation, such as by being pinned to a separate magnetization layer (such as a permanent magnet). Different electrical resistances of the memory cell can be established by selectively orienting the magnetization of the free layer so as to be aligned with or opposite to the magnetization orientation of the reference layer. These different resistances can be utilized to indicate different memory states (e.g., logical 0 or 1) for the cell.

Other types of non-volatile memory cells use localized conductive paths to alter programmed resistance levels, such as in the case of resistive random access memory (RRAM). In an RRAM cell, opposing electrodes can be separated by an intermediary insulative layer to provide a first nominal resistance, such as a relatively high resistance. Application of a suitable programming voltage in a first direction across the cell can result in the formation of one or more conductive metalized filaments that extend through the insulative layer from one electrode layer to the other electrode layer. The presence of such filaments can lower the nominal resistance of the cell to a second, lower level. The filament can be retracted back to the originating layer by the application of a suitable programming voltage in the opposite direction across the cell.

In these and other types of memory cell configurations, asymmetries can exist at the cell level in that it can be more difficult to program a resistive sense element in a first direction as compared to a second direction. This can adversely affect data throughput and data consumption rates of the device.

SUMMARY

Various embodiments of the present invention are generally directed to an apparatus and method for compensating for asymmetric write current in a non-volatile memory cell, such as but not limited to a resistive random access memory (RRAM) or spin-torque transfer random access memory (STRAM) cell.

In accordance with some embodiments, the apparatus generally comprises a nonvolatile unit cell comprising a switching device coupled to an asymmetric resistive sense element (RSE). The RSE is physically oriented within the unit cell relative to the switching device such that a hard direction for programming the RSE is aligned with an easy direction of programming the unit cell, and an easy direction for programming the RSE is aligned with a hard direction for programming the unit cell to compensate for write current asymmetry in the unit cell.

In accordance with other embodiments, the method generally comprises a step of compensating for write current asymmetry in a nonvolatile unit cell by physically orienting an asymmetric resistive sense element (RSE) of the unit cell relative to a switching device of the unit cell such that a hard direction for programming the RSE is aligned with an easy direction of programming the unit cell, and an easy direction for programming the RSE is aligned with a hard direction for programming the unit cell.

These and various other features and advantages which characterize the various embodiments of the present invention can be understood in view of the following detailed discussion and the accompanying drawings.

BRIEF DESCRIPTION OF THE DRAWINGS

FIG. 3 is a graphical representation of different gate voltages required to carry out the respective easy and hard direction programming of FIGS. 2A-2B.

FIGS. 4A-4B respectively display the RSE of FIGS. 2A-2B characterized as a spin-torque transfer random access memory (STRAM) element.

DETAILED DESCRIPTION

Figure 1:
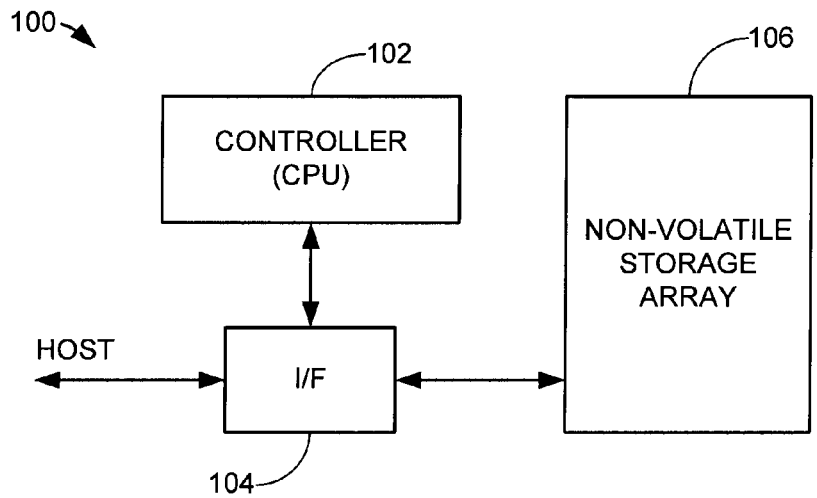
FIG. 1 provides a functional block representation of a data storage device.

FIG. 1 provides a functional block representation of a data storage device 100 to illustrate an exemplary environment in which various embodiments of the present invention can be advantageously practiced. The device 100 includes a top level controller 102, an interface (I/F) circuit 104 and a non-volatile data storage array 106. The I/F circuit 104 operates under the direction of the controller 102 to transfer user data between the array 106 and a host device (not shown). In some embodiments, the controller 102 is a programmable microcontroller, and the array 106 comprises an array of nonvolatile unit cells such as generally illustrated at 110 in FIGS. 2A and 2B.

Each unit cell 110 generally comprises a resistive sense element (RSE) 112 and a switching device 114. The RSE 112 can take any number of forms, such as but not limited to a spin-torque transfer random access memory (STRAM) element or a resistive random access memory (RRAM) element. The RSE 112 provides non-volatile storage of a programmed logical state in relation to a programmable resistance level of the RSE. For example, the RSE can be programmed to a relatively low resistance value, and this can be denoted to a selected logical value such as logical 0. A relatively high resistance programmed value can be denoted to correspond to a different logical value, such as logical 1. Multiple bits can alternatively be stored in each RSE 112, as desired.

The switching device 114 can take the form of a metal oxide semiconductor field effect transformer (MOSFET), and can be arranged in series with the RSE 112 as shown. The switching device 114 is shown to be in an open position in FIG. 2A, denoting the presence of a low conductivity path to substantially prevent passage of currents through the unit cell 110. The switching device 114 is in a closed position in FIG. 2B, denoting a relatively high conductivity path, thereby allowing the passage of current through the unit cell 110 during read and write operations.

Figure 2A:
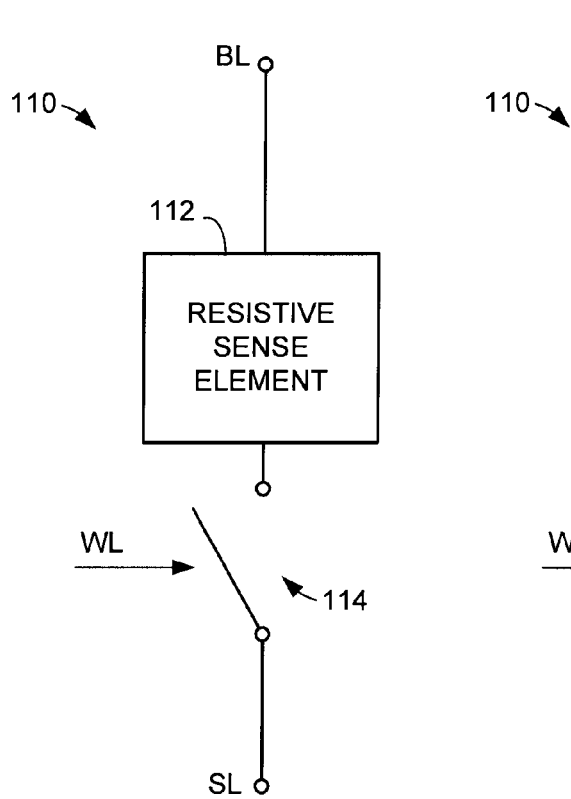
FIGS. 2A-2B generally illustrate a unit cell of the data storage device of FIG. 1 to illustrate respective easy and hard directions for programming the unit cell.
Figure 2B:
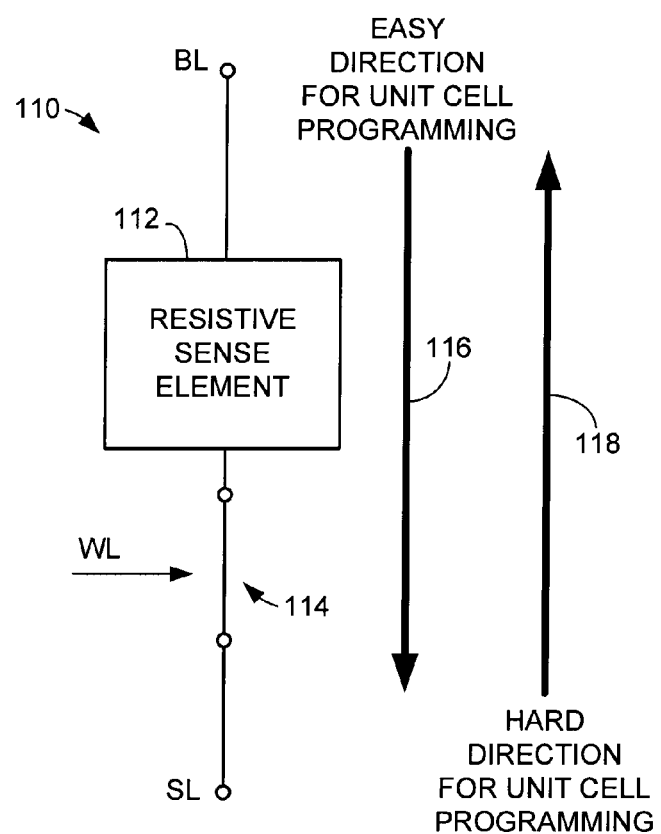

When the switching device 114 is characterized as a MOSFET, a word line (WL) can be coupled to a gate of the device, and a suitable gate voltage can be applied to establish the requisite drain to source conductivity set forth in FIG. 2B. Once the switching device 114 is placed in a conductive state, a read or write current can be passed through the cell 110 between a bit line (BL) and a source line (SL).

The RSE 112 is programmed by applying a suitable write (programming) current through the unit cell 110 in the appropriate direction to set the RSE to the desired programmed state. It is contemplated that application of a write current in a first direction through the unit cell 110 will result in the writing of a first state, and the application of a write current in an opposite second direction through the unit cell 110 will result in the writing of a second state.

While operable, unit cell configurations such as illustrated in FIGS. 2A and 2B can be subject to asymmetric write current characteristics at the cell level; that is, significantly greater current density may be required to program the cell 110 in a first direction through the cell as compared to the current density required to program the cell in a second direction through the cell. For purposes of the present discussion, the lower current direction will be referred to herein as the "easy" direction, such as denoted by arrow 116. The higher current direction will be referred to herein as the "hard" direction, such as denoted by arrow 118.

A number of factors can contribute to such write current asymmetry. One factor relates to the relative ordering of the RSE 112 and the switching device (transistor) 114 with respect to the direction of the applied write current; that is, whether the write current passes through the RSE first, or passes through the transistor first.

For the exemplary unit cell 110 in FIGS. 2A-2B, it is contemplated that it will be relatively easy to write the state of the RSE 112 when the current is passed in the direction 116 such that the write current encounters the RSE prior to the drain-source juncture of the MOSFET 114. Contrawise, it is contemplated that it will be more difficult to write in the opposite direction 118 when the write current passes through the drain-source juncture of the MOSFET 114 prior to encountering the RSE 112.

The current that the MOSFET 114 can supply is dependent upon the respective gate, source and drain voltages $V_G$, $V_S$ and $V_D$. In the easy direction, the gate-source voltage $V_{GS}$ will be generally equal to $V_G$, that is, $$V_{GS}=V_G \quad (1)$$

In the hard direction, however, the gate-source voltage $V_{GS}$ will be:

$$V_{GS}=V_G-I_C R \quad (2)$$

Where R is the programmed resistance of the RSE, and $I_C$ is the current through the unit cell. Since the drain-to-source current is proportional to the gate-source voltage when the MOSFET is operated in the linear region, greater current will flow in the easy direction as compared to the hard direction.

FIG. 3 graphically illustrates this asymmetric effect. In FIG. 3, a number of exemplary I-V plots are provided with a voltage x-axis 120 and a current magnitude y-axis 122. The voltage along the x-axis 120 generally corresponds to a drain voltage $V_D$ of the transistor 114, and the current along the y-axis 122 generally corresponds to current $I_C$ through the cell.

A first curve 124 shows the relationship between $V_D$ and $I_C$ for a gate voltage $V_G$ of about 1.2V in the easy direction (e.g., 116 in FIG. 2B). Second and third curves 126, 128 show the corresponding relationships for gate voltages of 1.2V and 1.7V in the hard direction (e.g., 118 in FIG. 2B).

From FIG. 3 it will be observed that the use of the same gate voltage ($V_G$=1.2 V) results in varying magnitudes of write current; indeed, the write current magnitude in the easy direction (curve 124) is substantially greater than the magnitude of write current in the hard direction (curve 128) for this same gate voltage. Significantly increasing the gate voltage $V_G$ from 1.2V to 1.7V still fails to achieve the same magnitude of write current (compare curve 126 with curve 128).

Accordingly, various embodiments of the present invention operate to compensate for asymmetric write characteristics of a nonvolatile unit cell. As explained below, this is generally carried out by physically orienting an asymmetric resistive sense element (RSE) of the unit cell, such as the RSE 112 in FIGS. 2A-2B, relative to a switching device of the unit cell, such as the transistor 114 in FIGS. 2A-2B, such that a hard direction for programming the RSE is aligned with an easy direction of programming the unit cell, and an easy direction for programming the RSE is aligned with a hard direction for programming the unit cell. In this way, substantially the same driver effort can be utilized to program the cell in both directions. These and various other features will become apparent in view of the following discussion.

FIGS. 4A and 4B provide respective elevational representations of a resistive sense element characterized as an STRAM element 130. It will be appreciated that the present use of an STRAM element is merely for purposes of illustration and is not limiting. Rather, a variety of other RSE configurations, including but not limited to RRAM elements, can be readily used.

The STRAM element 130 forms a magnetic tunneling junction (MTJ) 132 disposed between a first electrode layer 134 and a second electrode layer 136. The MTJ 132 includes a fixed magnetic reference layer 138 and a free magnetic layer 140 separated by an intervening barrier layer 142. In some embodiments, the reference layer 138 comprises spin polarizing material that orients the spin of current passing through the RSE 130 in a predetermined direction. The magnetization direction of the reference layer 138 may be pinned to a separate layer (not shown) that maintains the fixed magnetic layer 138 in a specified magnetic orientation. In other embodiments, the first and second electrodes 134 and 136 have spin polarizing characteristics capable of injecting spin torque-transfer switching in the RSE 130.

The free layer 140 is also formed of a suitable magnetic material, but is arranged so as to have selectively different magnetization directions which are established responsive to the application of suitable write currents. The barrier layer 142 can take any number of suitable constructions, such as Magnesium Oxide (MgO) as shown. While the respective magnetization directions are shown to be substantially perpendicular to the direction of write current, those skilled in the art will appreciate that other magnetic orientations, including parallel orientations, can be utilized as desired. Moreover, those skilled in the art will appreciate that additional layers, including seed layers, shield layers, and additional free and/or reference layers can be incorporated into the RSE 130 as desired, but such have been omitted for clarity.

As shown by FIG. 4A, a low resistance state for the RSE 130 is achieved when the magnetization of the free magnetic layer 140 is oriented to be substantially in the same direction (parallel) as the magnetization of the fixed magnetic layer 138. To orient the RSE 130 in the parallel (P) low resistance state, a write current passes through the MTJ 132 in FIG. 4A so that the magnetization direction of the reference layer 138 sets the magnetic orientation of the free layer 140. Since electrons flow in the direction opposite to the direction of current, the write current direction passes from the free layer 140 to the reference layer 138 as shown, so that the electrons pass from the reference layer 138 to the free layer 140.

A high resistance state for the RSE 130 is shown in FIG. 4B and is characterized as an anti-parallel orientation in which the magnetization direction of the free layer 140 is substantially opposite that of the reference layer 138. To orient the RSE 130 in the anti-parallel (AP) resistance state, a write current passes through the MTJ 132 in FIG. 4B as shown, so that the spin-polarized electrons flow into the free layer 140.

As mentioned above, some RSEs are characterized as asymmetric RSEs in that the RSEs can exhibit asymmetric write current characteristics. Such asymmetry can be manifested by the need for greater current to program the RSE in a first write current direction as compared to a second, opposite write current direction. It has been found that some STRAM elements such as 130 in FIGS. 4A-4B exhibit such write current asymmetries, in that it is generally more difficult to switch the MTJ 132 from a parallel state to an anti-parallel state (P to AP) than it is to switch the MTJ 132 from an anti-parallel state to a parallel state (AP to P).

Figure 5A:
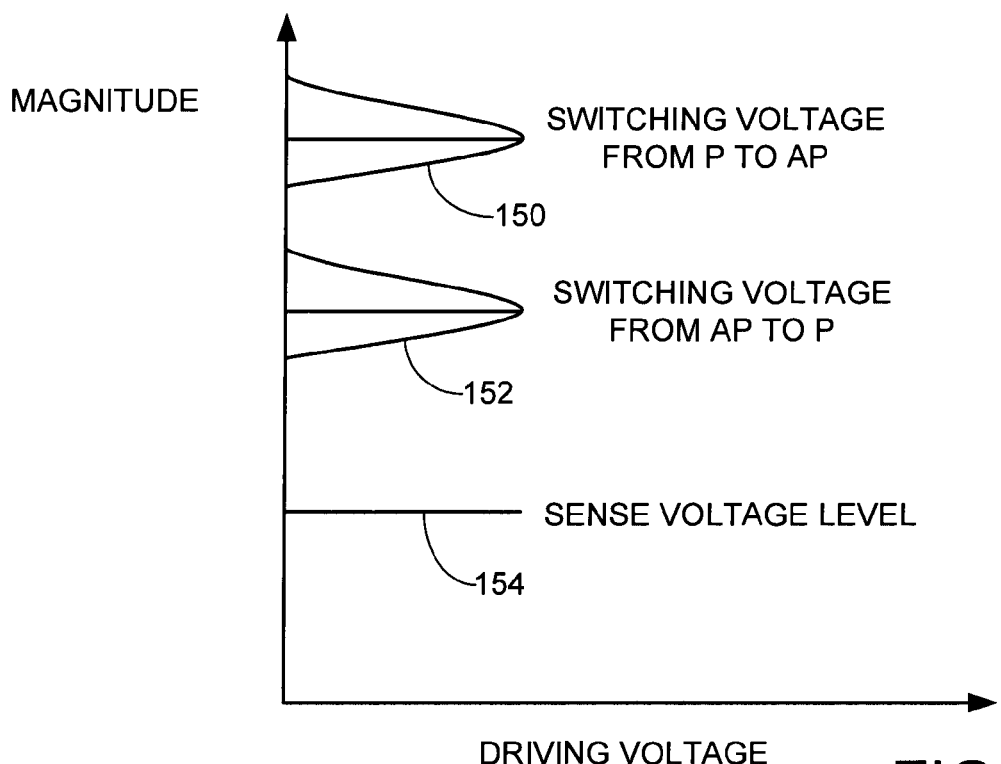
FIGS. 5A-5B respectively display voltage and current data obtained during the programming of the RSE of FIGS. 4A-4B in the hard and easy directions at the RSE level.
Figure 5B:
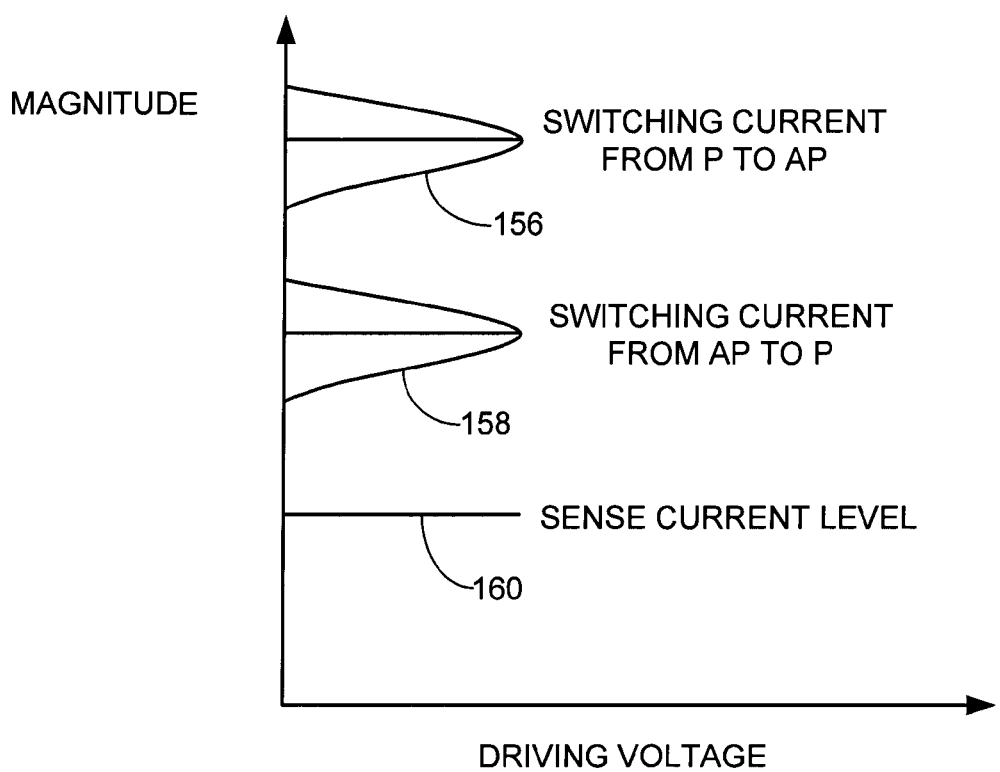

FIGS. 5A and 5B represent respective voltage and current switching values used during the writing and reading of an RSE such as the STRAM elements 130 of FIGS. 4A-4B. In FIG. 5A, a first distribution of switching voltages is denoted at 150 indicative of voltage pulse magnitudes required to switch the RSE programming state from parallel to anti-parallel (P to AP). A second distribution of switching voltages 152 indicates corresponding voltage pulse magnitudes to switch the RSE from anti-parallel to parallel (AP to P). A voltage sense level at 154 represents a voltage level that can be used to subsequently sense the programmed state of the RSE.

In FIG. 5B, corresponding switching current distributions are shown at 156 and 158 to switch from P to AP and from AP to P, respectively. A current sense level 160 represents a read current level that can be used to subsequently sense the programmed state of the RSE.

From the respective curves it can be readily seen that the required amounts of voltage and current magnitude to carry out the switching of the programmed state of the RSE can be significantly different. Such asymmetries at the RSE level can depend upon a number of factors, including RSE style and construction. Generally, for some RSEs such as the exemplary STRAM element 130, the density of a write current $J_{C0}$ required to change the resistance state of the RSE 130 can be expressed as follows:

$$J_{C0} = \left(\frac{\alpha}{\eta}\right)\left(\frac{2e}{\hbar}\right)(a^2 t M_S) H_K \left[1 + \frac{2\pi M_S + H}{H_K}\right] \quad (3)$$

where the parameters $\alpha$, $\eta$, a, t, $M_s$, $H_K$, H are damping constant, spin polarization, diameter, thickness, saturation magnetization, anisotropy field of the magnetic layer and the applied field. The spin polarization $\eta$ is angle dependent and can be expressed as:

$$\eta = \left(\frac{P}{2}\right)(1 + P^2 \cos\theta) \quad (4)$$

where $\theta$ is the initial angle between free layer and reference layer and P represents the tunneling spin polarization from a reference (source) ferromagnetic layer. The value P can be found as follows:

$$P = \left(\frac{TMR}{(2 + TMR)}\right)^{0.5} \quad (5)$$

If the variable $J_{C0(P-AP)}$ is used to identify the current density necessary to switch the element from parallel to anti-parallel (P-AP), and the variable $J_{C0(AP-P)}$ is used to identify the current density necessary to switch the element from anti-parallel to parallel (AP-P), then the ratio of these respective current densities can be expressed as:

$$\frac{J_{C0(P-AP)}}{J_{C0(AP-P)}} = \frac{1 + P^2}{1 - P^2} \quad (6)$$

Figure 6:
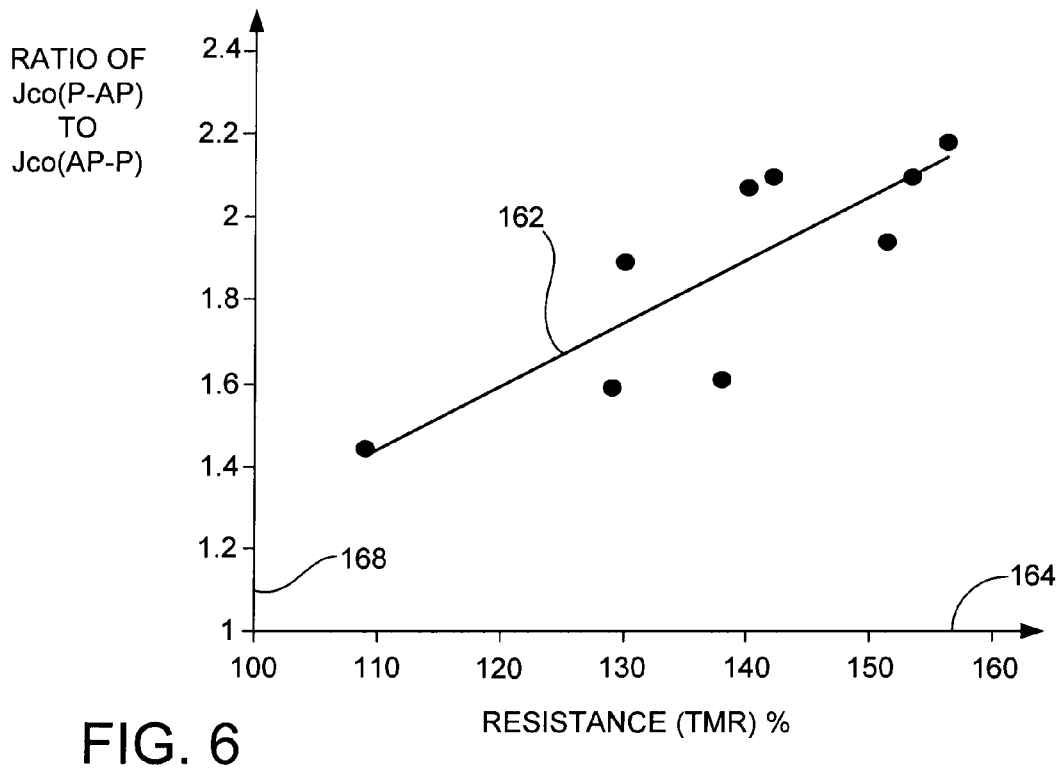
FIG. 6 graphically illustrates a relationship between a ratio of current densities in the respective hard and easy directions of FIGS. 5A-5B vs. tunneling magnetic resistance (TMR).

It follows that the ratio of the respective write currents generally increases in relation to increases in TMR (tunneling magnetic resistance). This is confirmed by a ratio curve 162 set forth in FIG. 6. The curve 162 in FIG. 6 is plotted against a TMR (percentage, %) x-axis 164 and a ratio magnitude y-axis 166. As shown by the curve 162, increases in TMR generally provide a corresponding increase in the write current ratio.

Higher TMR is generally desirable in order to provide sufficient margin between the respective low and high resistance states (e.g., states 0 and 1). Increases in TMR, however, can have a deleterious effect of increasing the write effort necessary to write from parallel to anti-parallel (P-AP).

With regard to the corresponding voltage magnitudes required to write the respective states, set $V_{C0(P-AP)}$ to represent the voltage magnitude to effect the parallel to anti-parallel switching case. $V_{C0(AP-P)}$ correspondingly represents the voltage magnitude to effect switching from anti-parallel to parallel (AP-P). The ratio of these respective voltages can be expressed as:

$$\frac{V_{C0(P-AP)}}{V_{C0(AP-P)}} = \alpha \quad (7)$$

where α is the TMR at the associated $V_{C0}$ divided by the TMR at zero voltage.

Similar modeling and empirical data collection can be readily obtained for other types of RSEs, so the foregoing discussion of asymmetry in the programming of STRAM elements is merely illustrative and is not limiting to the scope of the claimed subject matter.

For example, those skilled in the art will recognize that some types of RRAM elements provide an intervening oxide layer between opposing electrode layers. Changes in RSE resistance are obtained by extending one or more electrically conductive metallization filaments through the oxide layer from one electrode to the other. Such filaments generally operate to lower the characteristic resistance of the cell, and are formed through the application of an appropriate voltage potential and/or current in the appropriate direction to promote metallization. Such filaments are subsequently retracted through the application of an appropriate write voltage potential and/or current in a different direction through the RSE. In these and other cases, it is well within the ability of the skilled artisan in view of the present disclosure to identify the presence of characteristic RSE based write asymmetries, and compensate the same by orienting the RSE appropriately within the unit cell.

In sum, the foregoing discussion has set forth two different types of write current asymmetries that may be encountered in a unit cell. A first type of write current asymmetry generally relates to the relative ordering of the RSE with respect to the transistor, such as discussed in FIGS. 2B and 3. In some embodiments, these may be expressed as a hard direction at the cell level corresponding to the write current encountering the transistor 114 prior to the RSE 112, and an easy direction at the cell level corresponding to the write current encountering the RSE 112 prior to the transistor 114.

A second type of write current asymmetry can also exist in relation to the transitional phases of the RSE as it is switched between respective resistance states. This is illustrated in FIGS. 5A-5B for the exemplary STRAM element 130 which encounters a hard direction when switching from parallel to anti-parallel (hard=P to AP), and an easy direction when switching from anti-parallel to parallel (easy=AP to P).

Accordingly, various embodiments of the present invention configure the unit cell so that the RSE is physically oriented relative to the switching device so as to generally align the hard direction for programming at the cell level with the easy direction for programming at the RSE level, and to align the easy direction for programming at the cell level with the hard direction for programming at the RSE level.

Generally, at the RSE level the hard direction for programming the RSE comprises a first direction in which a first write current can be applied through the RSE to set the RSE to a first resistive state, wherein the easy direction for programming the RSE comprises a second direction opposite the first direction in which a second write current can be applied through the RSE to set the RSE to a different, second resistive state, and wherein the first write current is greater in magnitude than the second write current.

The easy direction for programming the unit cell corresponds to a respective sequencing of the RSE and the switching device such that the first write current passes from a first control line, through the RSE and then through the switching device to a second control line. The hard direction for programming the unit cell corresponds to a respective sequencing of the RSE and the switching device such that the second write current passes from the second control line, through the switching device and then through the RSE to the first control line. One exemplary implementation of this structure is set forth by FIG. 7.

Figure 7:
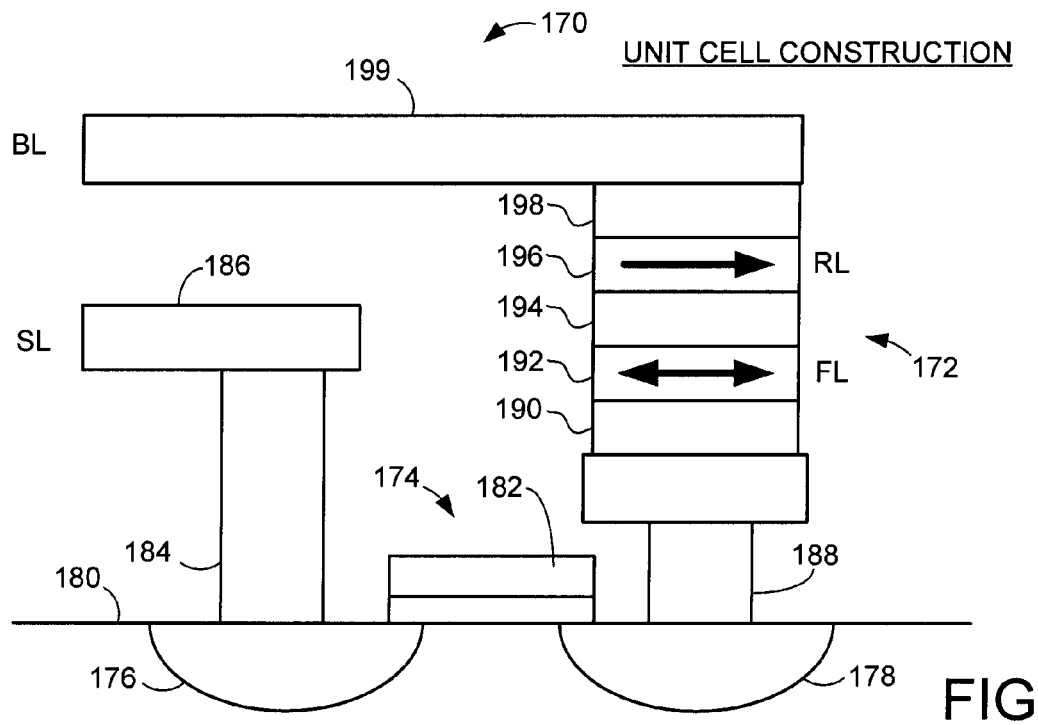
FIG. 7 provides an elevational representation of a unit cell configured in accordance with various embodiments to align the easy direction at the RSE level with the hard direction at the unit cell level, and vice versa.

FIG. 7 shows an exemplary unit cell 170 with an RSE 172 coupled to a switching device (transistor) 174. The transistor 174 includes n-doped regions 176, 178 in a semiconductor substrate 180. A control gate 182 is coupled to a word line (WL, not shown), so that application of a suitable voltage to the WL provides a drain-source conductive path through the substrate 180 between the regions 176, 178.

A support structure 184 couples a source line, SL 186 (or source plane) to the first region 176. A second support structure 188 couples the RSE 172 to the second region 178. The RSE 172 takes a general STRAM configuration as discussed in FIGS. 4A-4B, and includes a bottom electrode layer 190, a free layer (FL) 192, an isolation layer 194, a fixed reference layer (RL) 196 and top electrode layer 198. The top electrode layer 198 is affixed to a bit line, BL 199. Those skilled in the art will recognize this configuration is opposite that of conventional STRAM configurations which place the reference layer relatively closer to the transistor and the free layer relatively closer to the bit line.

The relative orientation of the RSE 172 within the cell 170 is such that the hard direction at the RSE level is the same as the easy direction at the cell level. To program the RSE 172 in FIG. 7 from the parallel state to the anti-parallel state (hard=P-AP), the write current flows from the BL 199, downwardly through the RSE 172, across the transistor 174 from region 178 to 176, and then to the SL 186. The electrons thus flow in the opposite direction, setting the magnetization of the free layer 192 to the anti-parallel (AP) state.

The RSE 172 in FIG. 7 is similarly oriented so that the easy direction at the RSE level is the same as the hard direction at the cell level. To program the RSE 172 from the anti-parallel state to the parallel state (easy=AP-P), the write current flows from the SL 186, through the transistor 174 from region 176 to 178, and then upwardly through the RSE 172 to the BL 199. The electrons pass in the opposite direction, so that the magnetization of the free layer 192 is set to that of the reference layer 196.

It will be noted that the free layer (FL) 192 of the RSE in FIG. 7 is located closest to the transistor 174. Such is merely illustrative of presently presented embodiments, as this placement is based on the fact that, for the particular RSE 172 in FIG. 7, this best aligns the hard RSE direction with the easy cell direction, and vice versa. It is contemplated that modeling and/or empirical analysis of other designs might show such other designs to exhibit the opposite RSE asymmetry characteristics, in which case the RSE in these other designs would be aligned accordingly.

Moreover, it will be appreciated that while the RSE and transistor are connected serially in each unit cell, such is also not necessarily required. The alignment of the RSE easy direction with the unit cell hard direction can be readily adapted for use in other arrangements, including NAND arrangements, as desired.

Figure 8:
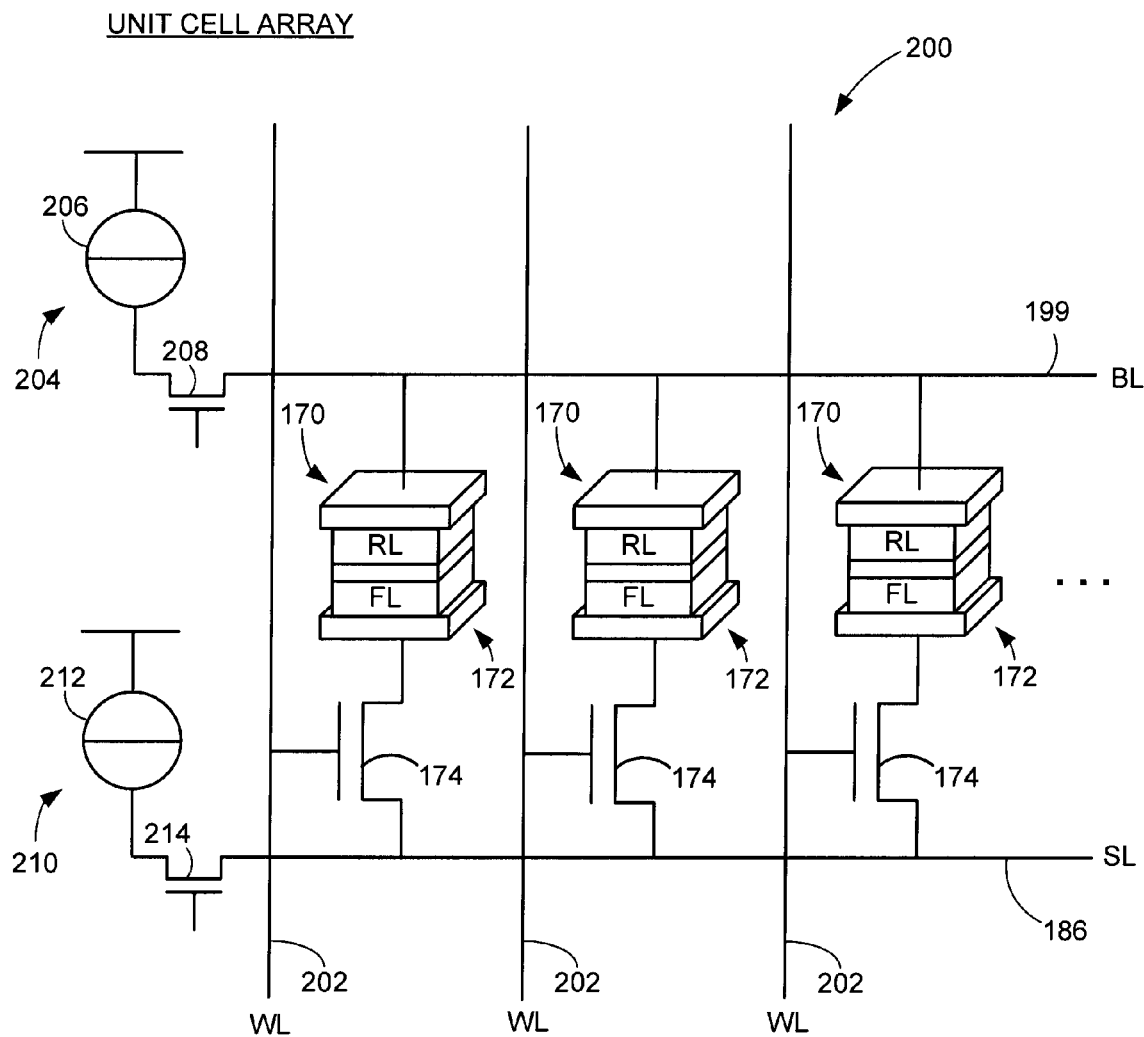
FIG. 8 shows an array of cells from FIG. 7 in conjunction with respective drivers to carry out write operations to the cells.

FIG. 8 provides a schematic depiction of a nonvolatile array 200. In some embodiments, the array 200 is made up of a number of structures as described in FIG. 7, and can be incorporated into the array 106 of FIG. 1. The layout and direction of the various source lines SL 186, bit lines BL 199 and word lines WL 202 are merely illustrative and can be altered as desired.

A BL driver 204 includes a current reference source 206 and switching device 208 to supply write currents that originate from the BL 199, pass through the appropriate unit cell 170 and to the SL 186. An SL driver 210 includes a current reference source 212 and a switching device 214 to supply write currents that originate from the SL 186, pass through the appropriate unit cell 170 and to the BL 199. A common driver can be used to supply each of these respective write currents, with the common driver operating as a first driver to supply the first write current and as a second driver to supply the second write current. Ground or other reference line paths (not shown) are switched in as necessary to complete the respective circuits.

The write current asymmetry compensation provided by the configuration of FIG. 8 results in the current pulse and magnitude characteristics from each driver being substantially the same, within a relatively small tolerance range. This enhances data throughput rates and reduces overall power consumption levels.

Figure 9:
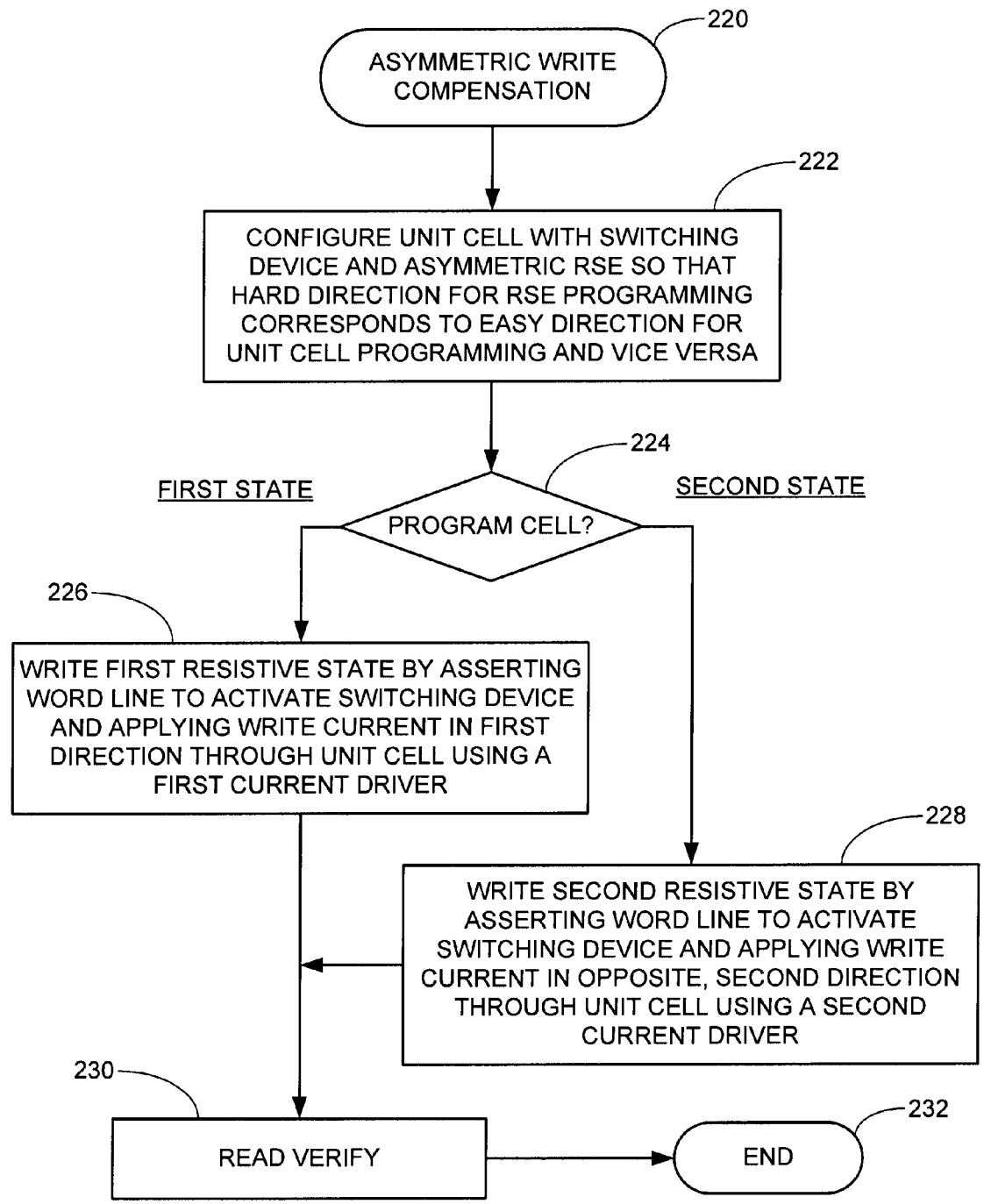
FIG. 9 is a flow chart for a WRITE CURRENT ASYMMETRY COMPENSATION routine.

FIG. 9 provides a flow chart for a WRITE CURRENT ASYMMETRY COMPENSATION routine 220 to summarize the foregoing discussion. At step 222, an array of non-volatile unit cells is provided such as set forth at 200 in FIG. 8. Each unit cell is configured to include a switching device, such as 174, and an asymmetric RSE, such as 172. The term "asymmetric RSE" relates to a characteristic whereby the RSE has a hard programming direction and an opposing easy programming direction, with the hard direction requiring a greater effort such as a higher current magnitude and/or pulse width to program the RSE to one state as compared to the easy direction in which a lower effort such as a lower current magnitude and/or pulse width is required to program the RSE to a different state.

Step 222 in FIG. 9 includes configuring the unit cell such that the hard direction for RSE programming corresponds to the easy direction for the unit cell programming. As discussed above, the easy direction for the unit cell programming can comprise a direction in which a write current encounters the RSE prior to the switching device. It is contemplated that step 222 is carried out during device manufacturing, and includes modeling and/or empirical analysis of various designs to identify such asymmetric characteristics.

Decision step 224 and those which follow generally describe subsequent operation of the device to write data to the array. At such time that a write operation is desired, the flow passes from decision step 224 to steps 226 or 228. In step 226, a first resistive state is written by asserting a word line (such as 202 in FIG. 8) to activate the switching device, and using a first write driver (such as the BL driver 204 in FIG. 8) to apply a first write current in a first direction through the unit cell. Alternatively, in step 228 a second resistive state is written by asserting a word line (such as 202 in FIG. 8) to activate the switching device, using a second write driver (such as the SL driver 210 in FIG. 8) to apply a second write current in a second direction through the unit cell. It is contemplated that the respective write currents will be substantially the same.

The flow of FIG. 9 continues with an optional read verify operation at step 230, after which the process ends at step 232. It will be appreciated that the flow returns to decision step 224 as desired to write additional data to the unit cells in the array. The written data are verified at step 230, as well as read during subsequent read operations, in any suitable manner, such as through the application of a read current through the cell and comparison of the voltage drop across the cell to a reference voltage via a sense amplifier (not shown).

As mentioned previously, RSEs can be configured to store multiple bits of data, rather than just two states (e.g., logical 0 or 1) as described in the various embodiments presented above. For example, an RSE may be configured to accept programmable states which correspond to four different resistances $R_1$ through $R_4$, with $R_1<R_2<R_3<R_4$. Each programmed state corresponds to two bits of data; for example, a resistance of $R_1$ might be used to designate a programmed state of 00, $R_2$ might correspond to the state 01, $R_3$ might correspond to the state 10, and $R_4$ might correspond to the state 11. More generally, an RSE may be programmed to provide $2^N$ different programmed resistances, in which case the RSE can store N distinct logical states.

The routine of FIG. 9 can be readily adapted to operate for such multi-bit RSEs. For example, a table can be constructed to identify the appropriate write currents to be supplied to change the programming of the RSE from any initial state to any final state. For example, a different write current may be supplied to change an RSE from $R_3$ to $R_1$ as compared to change the RSE from $R_3$ to $R_2$. Nevertheless, it is generally contemplated that write current asymmetries will be compensated using the above approach; for example, the effort required to change from $R_3$ to $R_2$ in a first direction will generally match the effort required to change from $R_2$ to $R_3$ in a second direction.

Figure 10:
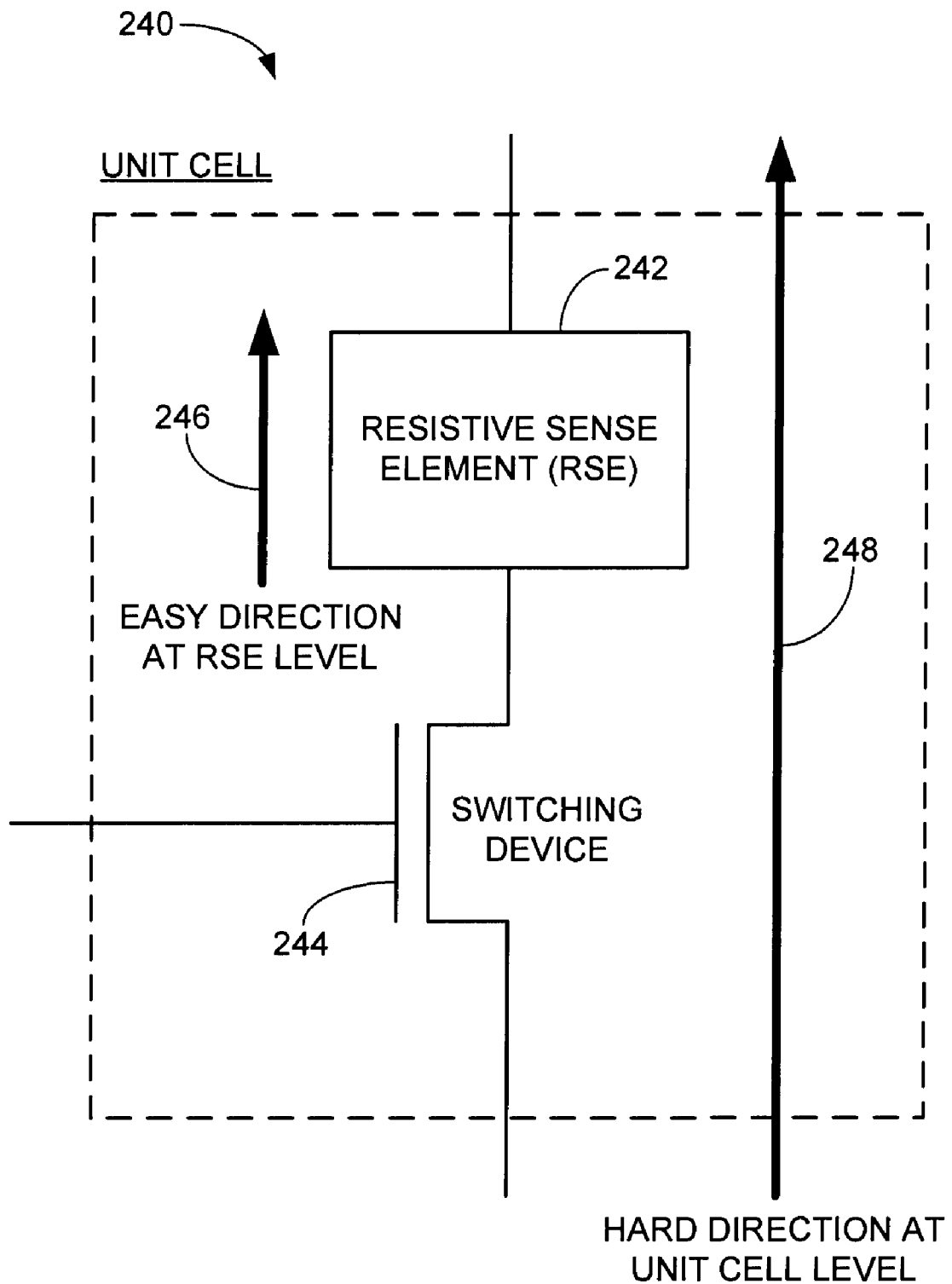
FIG. 10 is a functional block representation of an exemplary unit cell to show a physical orientation of an RSE relative to a switching device in accordance with various embodiments.

FIG. 10 shows an exemplary unit cell 240 constructed in accordance with the various embodiments discussed above to compensate for write current asymmetry in the unit cell. The unit cell 240 includes a resistive sense element (RSE) 242 coupled to a switching device 244. The RSE 242 is oriented within the unit cell 240 relative to the switching device 244 such that an easy direction for programming the RSE, indicated by arrow 246, is aligned with (i.e., extends in the same direction as) a hard direction for programming the unit cell, indicated by arrow 248.

Although not expressly shown in FIG. 10, it will be appreciated that the hard direction for programming the RSE 242 is in the opposite direction of arrow 246, the easy direction for programming the unit cell is in the opposite direction of arrow 248, and these directions are respectively aligned as well.

It will now be appreciated that the various embodiments presented herein provide a number of benefits over the prior art. Evaluating a particular RSE design to identify RSE level asymmetries and orienting the RSE accordingly to offset cell level asymmetries as disclosed herein can provide enhanced data throughput during operation, reduce power consumption and power handling requirements of the various drivers and transistors, facilitate increased data densities, and reduce fabrication costs. The various embodiments discussed herein have numerous potential applications and are not limited to a certain field of electronic media or type of data storage devices.

For purposes of the appended claims, reference to various directions of current will be understood consistent with the foregoing discussion to refer to flowing from a higher potential to a lower potential. The actual movement of electrons will be recognized to be in the opposite direction.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A data storage device, comprising:
an array of non-volatile memory cells, each memory cell comprising a switching device and a resistive random access memory (RRAM) element oriented relative to the switching device such that a hard direction for programming the RRAM element is aligned with an easy direction of programming the memory cell and an easy direction for programming the RRAM element is aligned with a hard direction for programming the memory cell; and
a write circuit adapted to provide each memory cell in the array with a first write current in the hard direction to program the associated RRAM element to a first logical state and a second write current in the opposing easy direction to program the associated RRAM element to a different, second logical state, the first write current having a magnitude that is greater than a magnitude of the second write current.

2. The data storage device of claim 1, in which the switching device in each memory cell is characterized as a transistor having a drain-to-source conductive path in series with the associated RRAM element so that the first write current passes through the drain-to-source conduction path prior to passing through the associated RRAM element and so that the second write current passes through the RRAM element prior to passing through the drain-to-source conduction path.

3. The data storage device of claim 1, in which the switching device in each memory cell is characterized as a metal oxide semiconductor field effect transistor (MOSFET) having respective drain, source and gate terminals, and in which the write circuit is further adapted to apply a voltage to the gate terminal of the switching device of a selected memory cell during the respective application of the first or second write currents.

4. The data storage device of claim 1, further comprising a controller adapted to direct the write circuit to write user data to the array responsive to an input from a host device coupled to the data storage device.

5. The data storage device of claim 1, in which the write circuit comprises a first write driver which applies the first write current to each of a plurality of selected memory cells in the array in turn, and a second write driver which applies the second write current to each of a plurality of selected memory cells in the array in turn.

6. The data storage device of claim 1, in which, for each memory cell in the array, the switching device is connected in series with the RRAM element between a first control line and a second control line, the write circuit further adapted to apply the first write current to the first control line prior to passage through the associated memory cell and to apply the second write current to the second control line prior to passage through the associated memory cell.

7. The data storage device of claim 1, in which the RRAM element in each memory cell in the array comprises opposing top and bottom electrode layers separated by an intervening layer into which metal filaments can be formed during application of the first or second write current to said element.

8. A solid state memory array comprising a plurality of memory cells formed on a semiconductor substrate and arranged into rows and columns, each memory cell comprising a switching transistor and a resistive random access memory (RRAM) element, the RRAM element oriented relative to the switching device such that a hard direction for programming the RRAM element is aligned with an easy direction of programming the memory cell and an easy direction for programming the RRAM element is aligned with a hard direction for programming the memory cell.

9. The memory array of claim 8, in which for each memory cell in the array, the transistor is provided with a drain-to-source conductive path in series with the associated RRAM element so that a first write current in the hard direction passes through the drain-to-source conduction path prior to passing through the associated RRAM element and a second write current in the easy direction passes through the RRAM element prior to passing through the drain-to-source conduction path, the first write current having a magnitude that is greater than a magnitude of the second write current.

10. The memory array of claim 8, in which the switching transistor comprises localized n+ doped regions in the substrate to form respective source and drain portions of the transistor with a channel region therebetween, and a structure formed above the channel region that extends adjacent the localized n+ doped regions to form a gate portion.

11. The memory array of claim 8, in conjunction with a write circuit adapted to pass a first write current in the hard direction through each cell in turn to program the associated RRAM element to a first resistive state and a second write current in the easy direction through each cell in turn to program the associated RRAM element to a different, second resistive state.

12. The memory array of claim 8, in which the switching transistor in each memory cell is characterized as a metal oxide semiconductor field effect transistor (MOSFET) having respective drain, source and gate terminals, the gate terminal adapted to receive a gate voltage to place the switching transistor in a conductive state between the drain and source terminals.

13. The memory array of claim 8, in conjunction with a controller adapted to direct write currents to the array to write user data thereto responsive to an input from a host device.

14. The memory array of claim 8, in which the memory cells are respective coupled to control lines which pass adjacent the array in orthogonal directions.

15. The memory array of claim 8, in which the RRAM element in each memory cell in said plurality of memory cells comprises opposing top and bottom electrode layers separated by an intervening layer into which metal filaments can be formed during application of write currents in the hard or easy direction.

16. A method comprising:
arranging a plurality of non-volatile memory cells into a memory array, each memory cell comprising a switching device and a resistive random access memory (RRAM) element oriented relative to the switching device such that a hard direction for programming the RRAM element is aligned with an easy direction of programming the memory cell and an easy direction for programming the RRAM element is aligned with a hard direction for programming the memory cell; and
programming a selected memory cell in the array by passing a first write current in the hard direction through the selected memory cell to program the associated RRAM element to a first logical state and a second write current in the opposing easy direction to program the associated RRAM element to a different, second logical state, the first write current having a magnitude that is greater than a magnitude of the second write current.

17. The method of claim 16, in which the switching device in each memory cell is characterized as a transistor having a drain-to-source conductive path in series with the associated RRAM element so that the first write current passes through the drain-to-source conduction path prior to passing through the associated RRAM element and so that the second write current passes through the RRAM element prior to passing through the drain-to-source conduction path.

18. The method of claim 16, in which the switching device in each memory cell is characterized as a metal oxide semiconductor field effect transistor (MOSFET) having respective drain, source and gate terminals, and in which the write circuit is further adapted to apply a voltage to the gate terminal of the switching device of a selected memory cell during the respective application of the first or second write currents.

19. The method of claim 16, in which the programming step comprises using a first write driver which applies the first write current to the selected memory cell such that the first write current passes through a drain-source path of the switching device prior to passing through the associated RRAM element, and using a second write driver which applies the second write current to the selected memory cell such that the second write current passes through the RRAM element prior to passing through the drain-source path of the switching device.

20. The method of claim 16, in which the RRAM element in each memory cell in the array comprises opposing top and bottom electrode layers separated by an intervening layer into which metal filaments can be formed during application of the first or second write current to said element.

* * * * *